United States Patent
Anderson et al.

(10) Patent No.: US 7,183,142 B2
(45) Date of Patent: Feb. 27, 2007

(54) FINFETS WITH LONG GATE LENGTH AT HIGH DENSITY

(75) Inventors: Brent A. Anderson, Jeriho, VT (US); Kerry Bernstein, Underhill, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,615

(22) Filed: Jan. 13, 2005

(65) Prior Publication Data
US 2006/0154426 A1   Jul. 13, 2006

(51) Int. Cl.
*H01L 21/335* (2006.01)
(52) U.S. Cl. .................................... 438/142
(58) Field of Classification Search ............... 257/691, 257/347; 438/142
See application file for complete search history.

(56) References Cited

U.S. PATENT DOCUMENTS

| | | | |
|---|---|---|---|
| 5,675,164 A | 10/1997 | Brunner et al. | |
| 6,413,802 B1 | 7/2002 | Hu et al. | |
| 6,642,090 B1 | 11/2003 | Fried et al. | |
| 6,662,350 B2 | 12/2003 | Fried et al. | |
| 6,794,718 B2 * | 9/2004 | Nowak et al. | 257/347 |
| 6,909,174 B2 * | 6/2005 | Schoenborn | 257/691 |
| 2002/0153587 A1 | 10/2002 | Adkisson et al. | |
| 2003/0067017 A1 | 4/2003 | Ieong et al. | |
| 2004/0036464 A1 | 2/2004 | Fried et al. | |

* cited by examiner

*Primary Examiner*—Carl Whitehead, Jr.
*Assistant Examiner*—Monica D. Harrison
(74) *Attorney, Agent, or Firm*—Gibb I.P. Law Firm, LLC; William D. Sabo, Esq.

(57) ABSTRACT

A method of manufacturing fin-type field effect transistors (FinFETs) forms a silicon layer above a substrate, forms a mask pattern above the silicon layer using a multi-step mask formation process, patterns the silicon layer into silicon fins using the mask pattern such that the silicon fins only remain below the mask pattern, removes the mask pattern to leave the fins on the substrate, and forms gate conductors over the fins at a non-perpendicular angle to the fins.

20 Claims, 9 Drawing Sheets

FINFETS WITH LONG GATE LENGTH AT HIGH DENSITY

BACKGROUND OF THE INVENTION

1. Field of the Invention

The invention generally relates to a method of manufacturing fin-type field effect transistors (FinFETs) that allows the length of the FinFET fins to be increased by angling the fins with respect to the gate conductors and prevents the angled fins from increasing the size of the FinFET array by increasing the density of the fins.

2. Description of the Related Art

A fin-type field effect transistor "FinFET" is a type of transistor that has a fin covered by a gate conductor. The gate conductor covers the channel portion of the fin and source and drain portions of the fin extend beyond the coverage of the gate conductor. FinFETs are discussed at length in U.S. Pat. No. 6,413,802 to Hu et al. (hereinafter "Hu"), which is incorporated herein by reference.

As Very Large Scale Integration (VLSI) drives the reduction of the size of transistors to smaller dimensions, the power supply voltage is no longer able to be reduced in proportion due to non-scaling threshold voltages of transistors. This limits the amount of size reduction that can be accomplished on the gate length of FETs, and FinFETs. The invention described below addresses these issues by increasing the effective length of the gate of the FinFET without increasing the size of the transistor array. This allows the size of the transistors to be reduced without reducing the effective length of the gates, thereby allowing the size of the transistor array to be continually decreased.

SUMMARY OF THE INVENTION

This disclosure presents a method of manufacturing fin-type field effect transistors (FinFETs). In embodiments of this method, a pattern of first mandrels is formed on a hardmask that is positioned on a silicon layer that overlies an insulator layer (substrate). Because the substrate comprises an insulator, the FinFETs comprise silicon-on-insulator (SOI) structures. First sidewall spacers are formed on the first mandrels and then the first mandrels are removed to leave the first sidewall spacers standing free on the hardmask layer.

Next, a sacrificial masking layer is formed over the first sidewall spacers and a pattern of second mandrels is formed on the masking layer. The second mandrels are patterned parallel to and shifted from positions of the first mandrels, such that the later formed fins are parallel to each other and are spaced from each other. Second sidewall spacers are formed on the second mandrels and the second mandrels are also removed to leave the second sidewall spacers standing free on the masking layer.

After this, the masking layer is patterned using the second sidewall spacers as a mask, such that the masking layer remains only below the second sidewall spacers. Next, the hardmask layer is patterned using the first sidewall spacers and remains of the masking layer that was below the second sidewall spacers. The first sidewall spacers make a first mask pattern and the second sidewall spacers and underlying patterned masking layer make a second pattern. The first mask pattern and the second mask pattern comprise linear features because they were formed using sidewall image transfer processing from the linear sidewalls of the mandrels.

Then, the first sidewall spacers, the second sidewall spacers, and the masking layer are removed to leave the patterned hardmask freestanding on the silicon layer. This method then patterns the silicon layer into silicon fins using the hardmask layer such that the silicon fins only remain below where the first sidewall spacers and the second sidewall spacers were positioned.

Next, gate oxides are formed on the fins and gate conductors are formed over the fins at a non-perpendicular angle to the fins. After forming the gate conductors, the method dopes exposed portions of the fins to form source and drain regions in the fins. Because the fins are angled with respect to the gates, the fins are longer than would be perpendicular fins. In other words, the length of the source/drain regions of the fins between adjacent gate conductors is longer because the fins travel at an acute or obtuse angle (not a right angle) between the gate conductors.

Therefore, the invention allows the length of the FinFET fins to be increased by angling the fins with respect to the gate conductors and prevents the angled fins from increasing the size of the array by increasing the density of the fins. This allows the length of the fins to be increased or allows the size of the FinFET array to be decreased without having to decrease the length of the fins. This allows smaller FinFET arrays to be created, which makes transistor devices smaller, lighter, faster, and less expensive.

These, and other, aspects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 1:
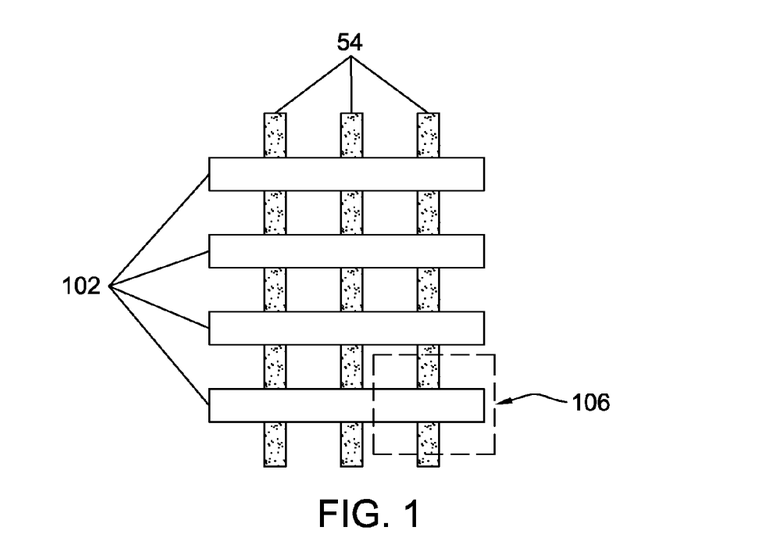
FIG. 1 is a schematic top-view diagram of an array of FinFET transistors.
Figure 2:
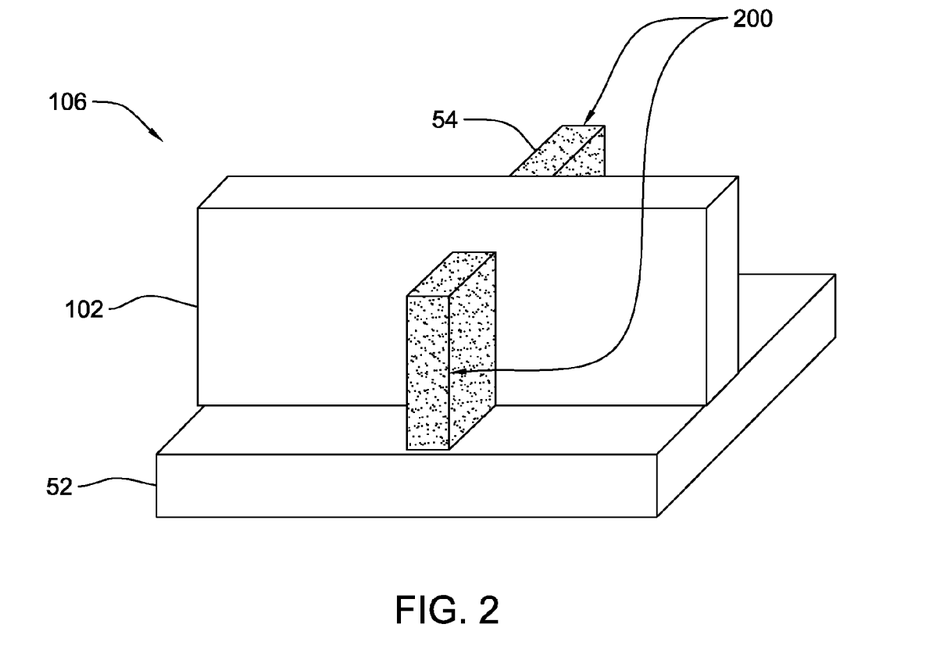
FIG. 2 is a schematic perspective-view diagram of a FinFET transistor.

FIG. 1 illustrates a FinFET array and includes gate conductors 102 and fins 54. One of the FinFET transistors within the array is illustrated by box 106. This transistor 106 is shown in perspective view in FIG. 2. Again, the gate conductor is shown as item 102 and the fin is shown as item 54. The fin 54 includes a channel region beneath the gate conductor 102 and source and drain regions 200 that extend from beneath the gate conductor 102. Item 52 illustrates the underlying insulator within this silicon-on-insulator (SOI) structure.

Figure 3:
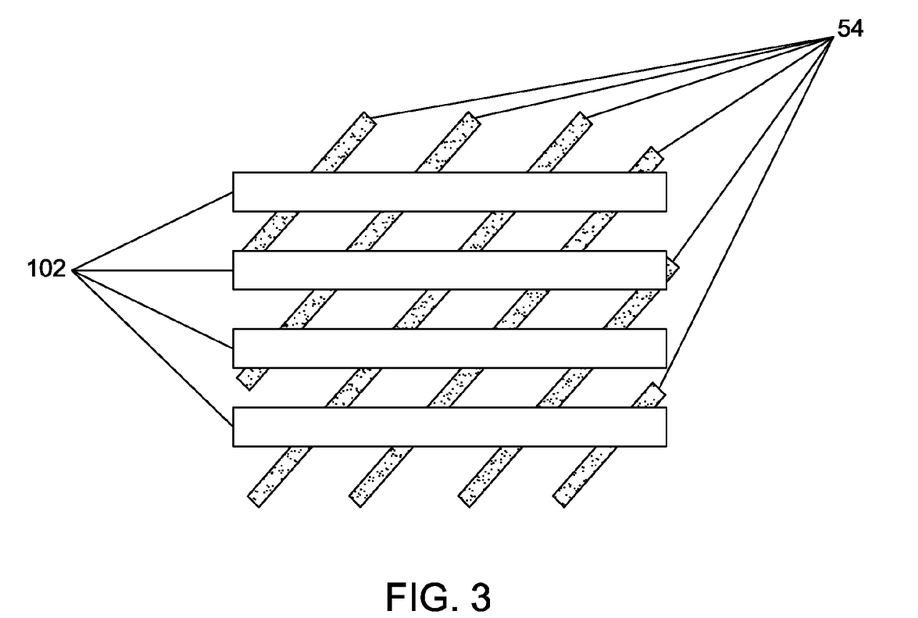
FIG. 3 is a schematic top-view diagram of an array of FinFET transistors.

One way of increasing the length of the fins is to form the fins 54 and an angle to the gate conductors 102 as shown in FIG. 3. This "angle" of the fins 54 is other than perpendicular and other than parallel to the gates 54. Because the fins 54 are angled with respect to the gates 102, the fins 54 are longer than would be perpendicular fins 54. In other words, the length of the source/drain regions of the fins 54 between adjacent gate conductors 102 is longer because the fins 54 travel at an acute or obtuse angle between the gate conductors 102 (not a right angle or parallel to the gate conductors 102). For example, the angle between the fin 54 and gate conductors 102 could be between 5 and 85 degrees, and more specifically between 30 and 60 degrees, and even more specifically 45 degrees.

However, when the fins 54 are angled with respect to the gate conductors 102, the size of the transistor array increases, if the spacing between the fins 54 and the number of transistors within the array is kept the same. Note that FIG. 3 includes the same number of transistors as shown in FIG. 1 yet the array in FIG. 3 is larger in that the transistors that are positioned at the ends of the gate conductors 102 are not useful transistors because they do not include fin sections extending from both sides of the gate conductor 102. Therefore, there are 12 transistors shown in both FIGS. 1 and 3, yet the array in FIG. 3 takes up more space. While there are a specific number of transistors illustrated in the drawings, one ordinarily skilled in the art would understand that the transistor array could include any number of transistors.

Figure 4:
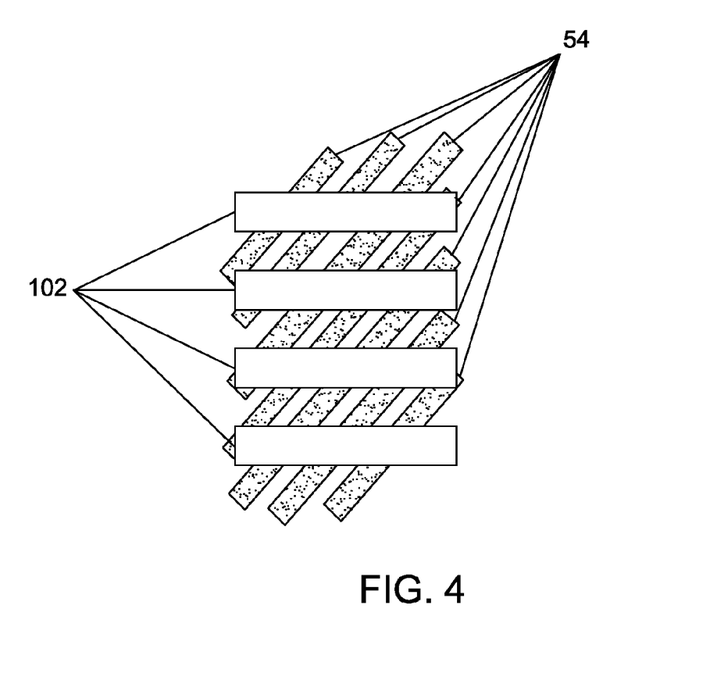
FIG. 4 is a schematic top-view diagram of an array of FinFET transistors.

In order to avoid increasing the size of the transistor array, the density of the fins 54 can be doubled, as shown in FIG. 4. This allows the length of the fins to be increased without increasing the size of the array, or this allows the size of the array to be decreased without decreasing the length of the fins. One difficulty associated with increasing the density of the fins 54 is that current manufacturing processes form the fins at the current lithographic minimum size, which makes decreasing the spacing between adjacent fins difficult or impossible. In other words, the current state of the art can only reliably form topographical features down to a specific minimum size using photolithographic and other similar techniques. While this size limit is continually decreasing as advances are made, there will always be a minimum current size at which features can reliably be formed. Thus, if the fins 54 in FIG. 3 are already formed at the current minimum lithographic size, it is difficult to double the density as shown in FIG. 4. Therefore, as shown in FIGS. 5–16, the invention utilizes a multiple sidewall image transfer (SIT) processing to decrease the spacing between the fins 54 and correspondingly increase the density of the fins 54.

As shown in the following drawings, a sidewall image transfer process involves forming a mandrel (e.g., a rectangular topographical feature) on a surface. In order to form the mandrel, a photolithographic material can be deposited over the surface. A pattern of light can be exposed on to the photolithographic material and the photolithographic material can be developed. Then, a chemical rinsing agent is applied to the photolithographic material and, depending upon whether the photolithographic material is positive or negative, the exposed or unexposed portion of the photolithographic material washes away, leaving the mandrels on the surface. The mandrel is preferably formed to a minimum lithographic size.

Then, sidewall spacers are formed on the sides of mandrel. The spacers are formed by depositing a conformal material over the mandrels. Then, a directional etching process is utilized that removes material from horizontal surfaces at a substantially faster rate than it removes material from vertical surfaces. This leaves the conformal material only on the sidewalls of the mandrels. The entire structure can be planarized using, for example, chemical mechanical polishing (CMP), if desired.

Following this, the mandrel is removed. This leaves the sidewall spacers freestanding as very small sub-lithographic mask features. The term sub-lithographic means that the features formed are smaller than what can be formed with lithographic means alone. Then, the underlying surface can be etched using the freestanding sidewall spacers as very small sub-lithographic masks. The below processing uses such sidewall image transfer mask features to pattern the fins of the FinFET transistors. However, the following processing utilizes two separate sidewall image transfer processes to produce multiple patterns of sub-lithographic mask features that are interleaved with each other. This effectively doubles the density of the sub-lithographic mask features, which allows the density of the fins that will be patterned using such sub-lithographic mask features to also be doubled.

Figure 5:
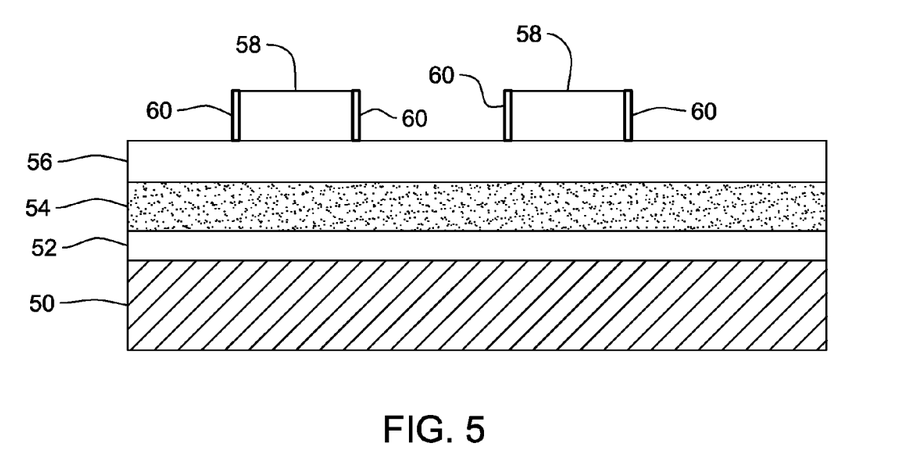
FIG. 5 is a schematic cross-sectional view diagram of a partially completed FinFET transistor.

More specifically, as shown in FIG. 5, a bottom silicon carrier 52 is above an insulator (e.g., SiO2) layer 50. Because the silicon carrier 52 is above the insulator 50, the FinFETs that are eventually formed will comprise silicon-on-insulator (SOI) structures. Above the insulator layer 52 is a thin silicon layer 54 (about 20–100 nm thick) and a hardmask 56 (e.g., SiO2). This laminated structure can be formed using a number of different well-known processing techniques including successive material deposition, bonding, oxide growth, periodic planarization, and other similar processes.

Figure 6:
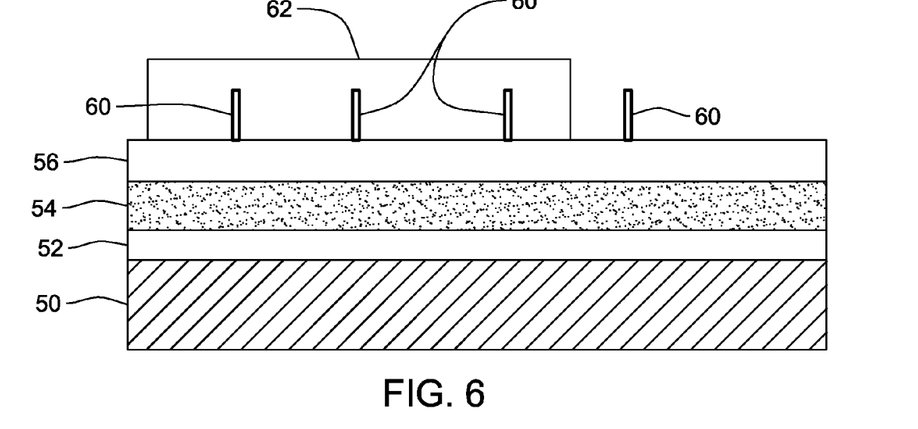
FIG. 6 is a schematic cross-sectional view diagram of a partially completed FinFET transistor.
Figure 7:
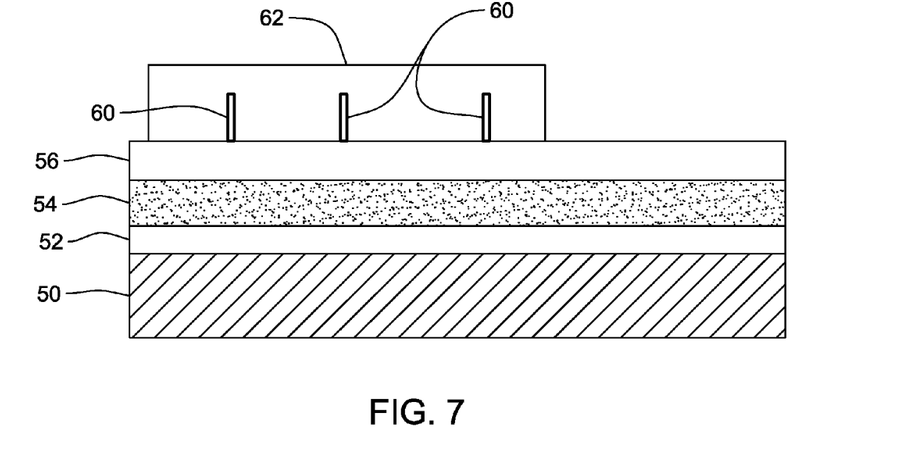
FIG. 7 is a schematic cross-sectional view diagram of a partially completed FinFET transistor.
Figure 8:
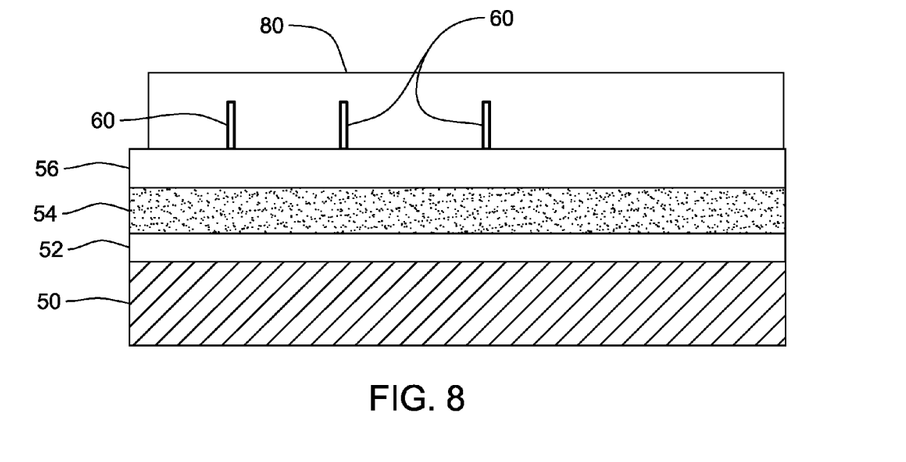
FIG. 8 is a schematic cross-sectional view diagram of a partially completed FinFET transistor.

A pattern of first mandrels 58 is formed above the silicon layer 54 on the hardmask layer 56 using the processing described above. First sidewall spacers 60 are formed on the first mandrels 58 and then the first mandrels 58 are removed to leave the first sidewall spacers 60 standing free on the hardmask layer 56, again, using the processing discussed above. Next, as shown in FIG. 6, a mask 62 is patterned over some of the first sidewall spacers 60, using well-known material deposition and patterning processes. Then, as shown in FIG. 7, the exposed mask portions 60 not protected by the mask 62 are removed. Next, the mask 62 is removed and a sacrificial masking layer 80 is deposited and planarized as shown in FIG. 8.

Figure 9:
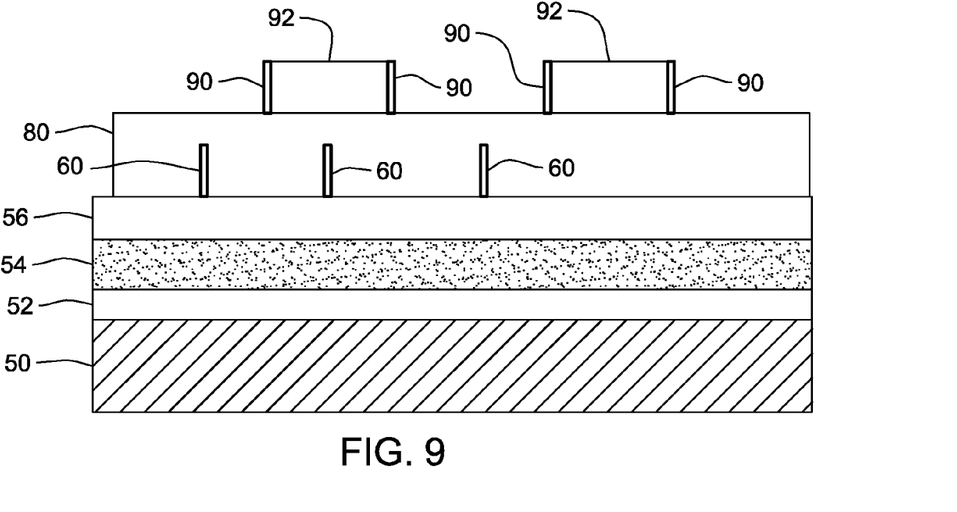
FIG. 9 is a schematic cross-sectional view diagram of a partially completed FinFET transistor.
Figure 10:
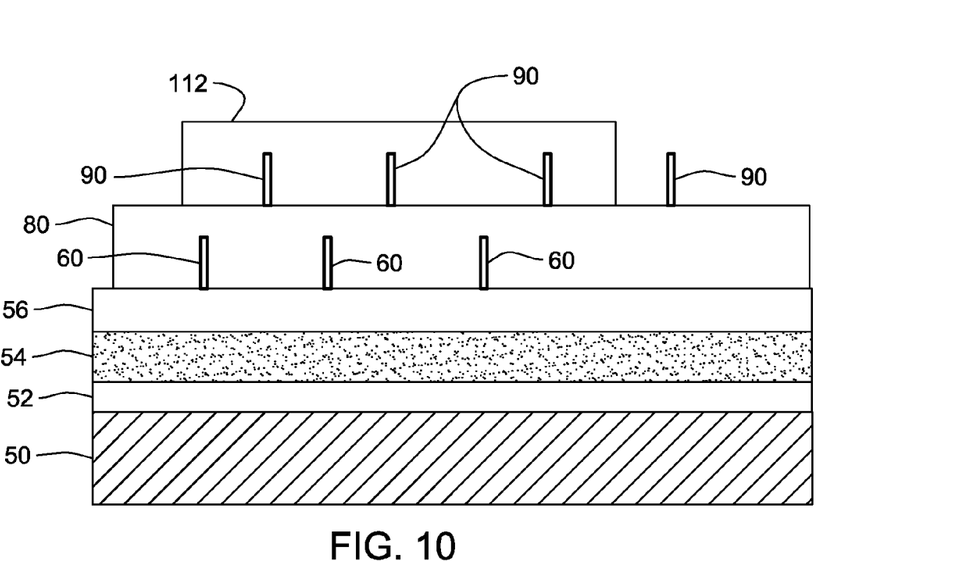
FIG. 10 is a schematic cross-sectional view diagram of a partially completed FinFET transistor.
Figure 11:
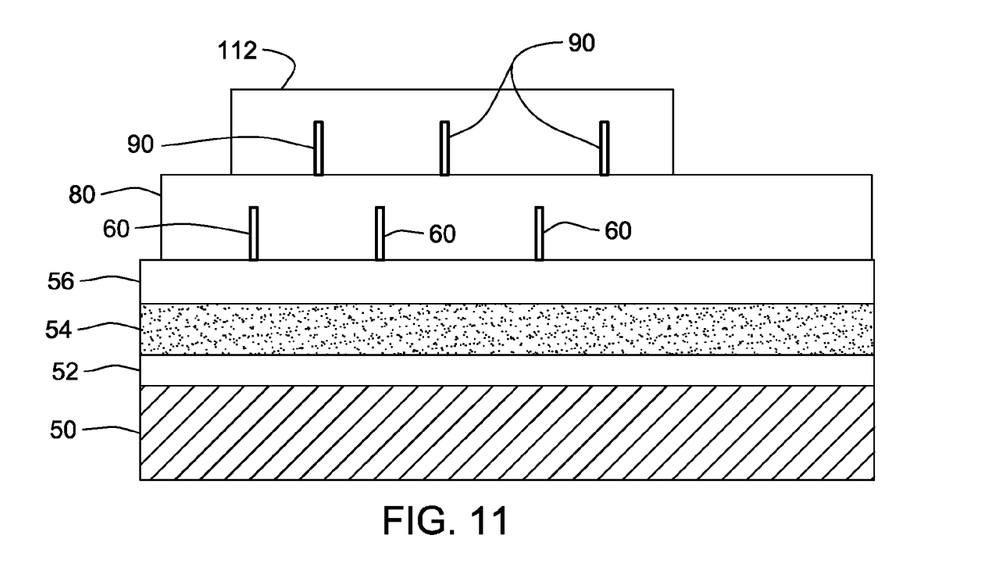
FIG. 11 is a schematic cross-sectional view diagram of a partially completed FinFET transistor.
Figure 12:
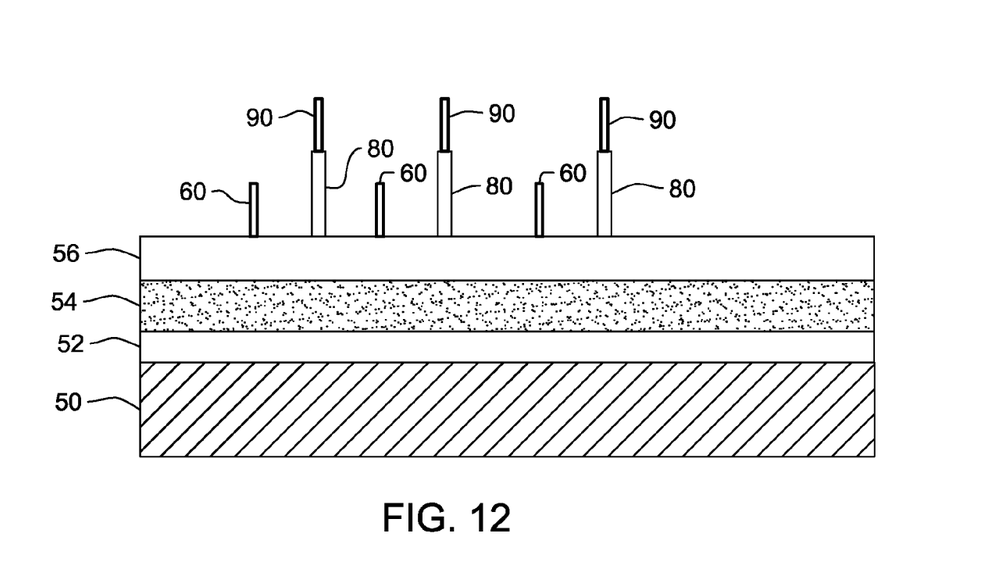
FIG. 12 is a schematic cross-sectional view diagram of a partially completed FinFET transistor.

In FIG. 9, a pattern of second mandrels 92 is formed over the masks 60 and on the sacrificial layer 80. The second mandrels 92 are patterned parallel to and shifted from positions of the first mandrels 58, such that the fins that will eventually be etched into the silicon layer 54 will be parallel to each other and evenly spaced from each other. Second sidewall spacers 90 are formed on the second mandrels 92 and the second mandrels 92 are also removed to leave the second sidewall spacers 90 standing free on the sacrificial layer 80 as shown in FIG. 10. As also shown in FIG. 10, another mask 112 is formed to protect selected sidewall spacers 90. Next, as shown in FIG. 11, the unprotected sidewall spacers 90 are removed using etching or similar processing. Then, the mask 112 is removed. After this, the sacrificial masking layer 80 is patterned using the second sidewall spacers 90 as a mask, such that the sacrificial masking layer 80 remains only below the second sidewall spacers 90, as shown in FIG. 12.

Figure 13:
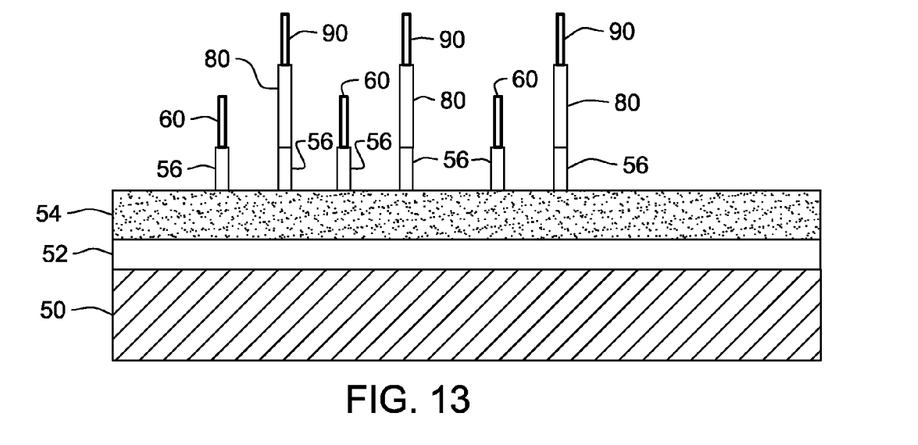
FIG. 13 is a schematic cross-sectional view diagram of a partially completed FinFET transistor.

Then, as shown in FIG. 13, the hardmask 56 is patterned using the first and second sidewall spacers 60, 90. In this way, the first sidewall spacers 60 make a first mask pattern and the second sidewall spacers 90 and underlying patterned sacrificial masking layer 80 make a second pattern. The first mask pattern and the second mask pattern comprise linear features because they were formed using the sidewall image transfer processing from the linear sidewalls of the mandrels 58, 92, and the first mask pattern is interleaved with the second mask pattern.

Figure 14:
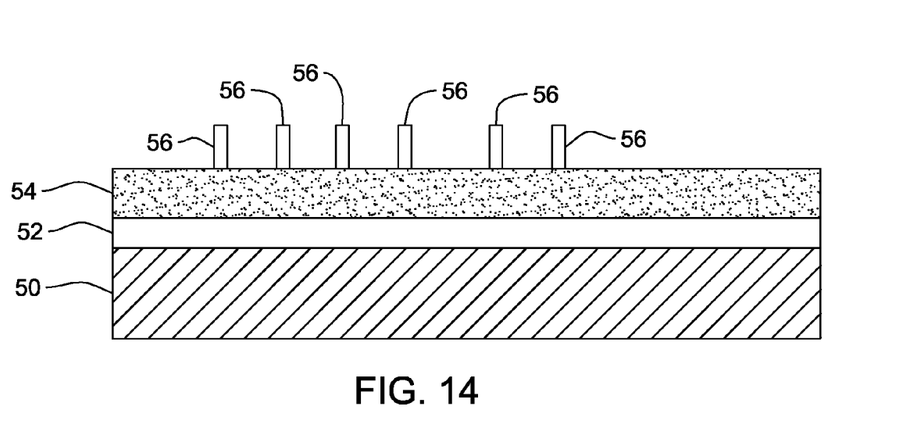
FIG. 14 is a schematic cross-sectional view diagram of a partially completed FinFET transistor.
Figure 15:
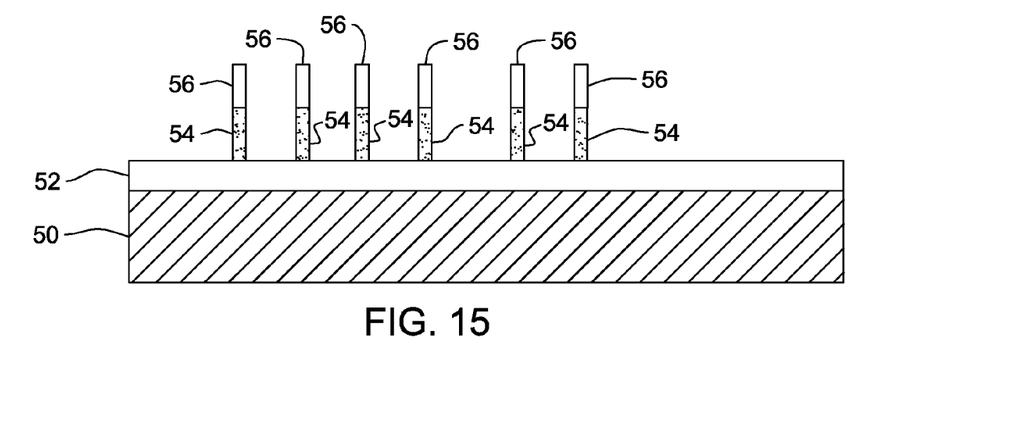
FIG. 15 is a schematic cross-sectional view diagram of a partially completed FinFET transistor.

The sidewall spacers 60, 90, and masking layer 80 are removed to leave the patterned hardmask 56 over the silicon layer 54, as shown in FIG. 14. Next, as shown in FIG. 15, this method then patterns the silicon layer 54 into silicon fins using the patterned hardmask 54 (which contains the first and second mask patterns) in an etching or similar material removal process. Thus, the silicon fins 54 only remain below positions where the first sidewall spacers 60 and the second sidewall spacers were located. The use of the second sidewall spacers 90 doubles a density of fins created during the patterning of the silicon layer, when compared to the first sidewall spacers 60 alone.

Figure 16:
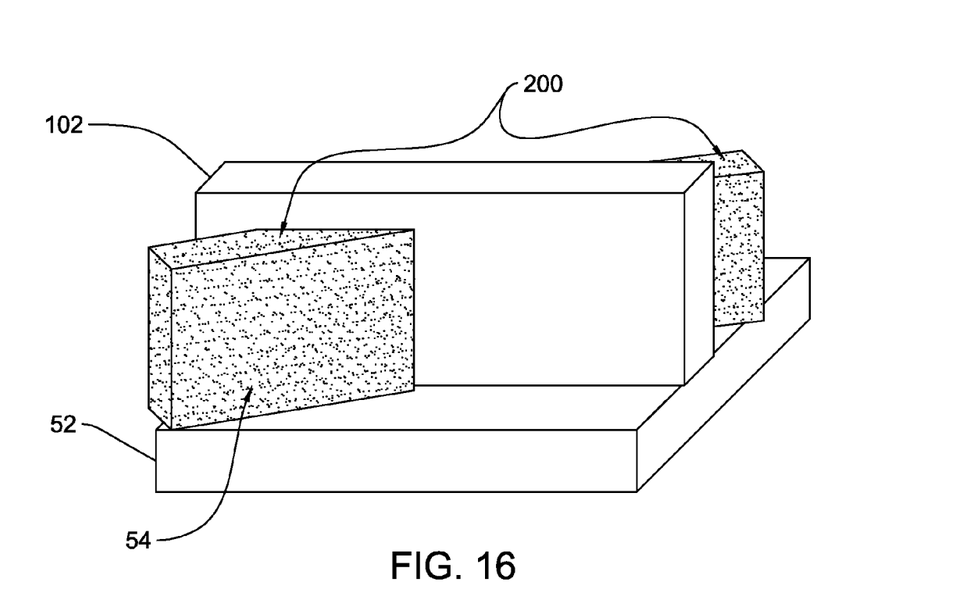
FIG. 16 is a schematic perspective view diagram of a partially completed FinFET transistor.

Next, as shown in FIG. 16, gate oxides are formed on the fins 54 and gate conductors 102 are formed over the fins at a non-perpendicular, non-parallel angle to the fins 54. After forming the gate conductors 102, the method dopes exposed portions of the fins 54 to form source and drain regions 200 in the fins 54. Because the fins 54 are angled with respect to the gates 102, the fins 54 are longer than would be perpendicular fins (shown in FIG. 2). In other words, the length of the source/drain regions 200 of the fins 54 between adjacent gate conductors 102 is longer because the fins 54 travel at an acute or obtuse angle (not a right angle) between the gate conductors 102.

Figure 17:
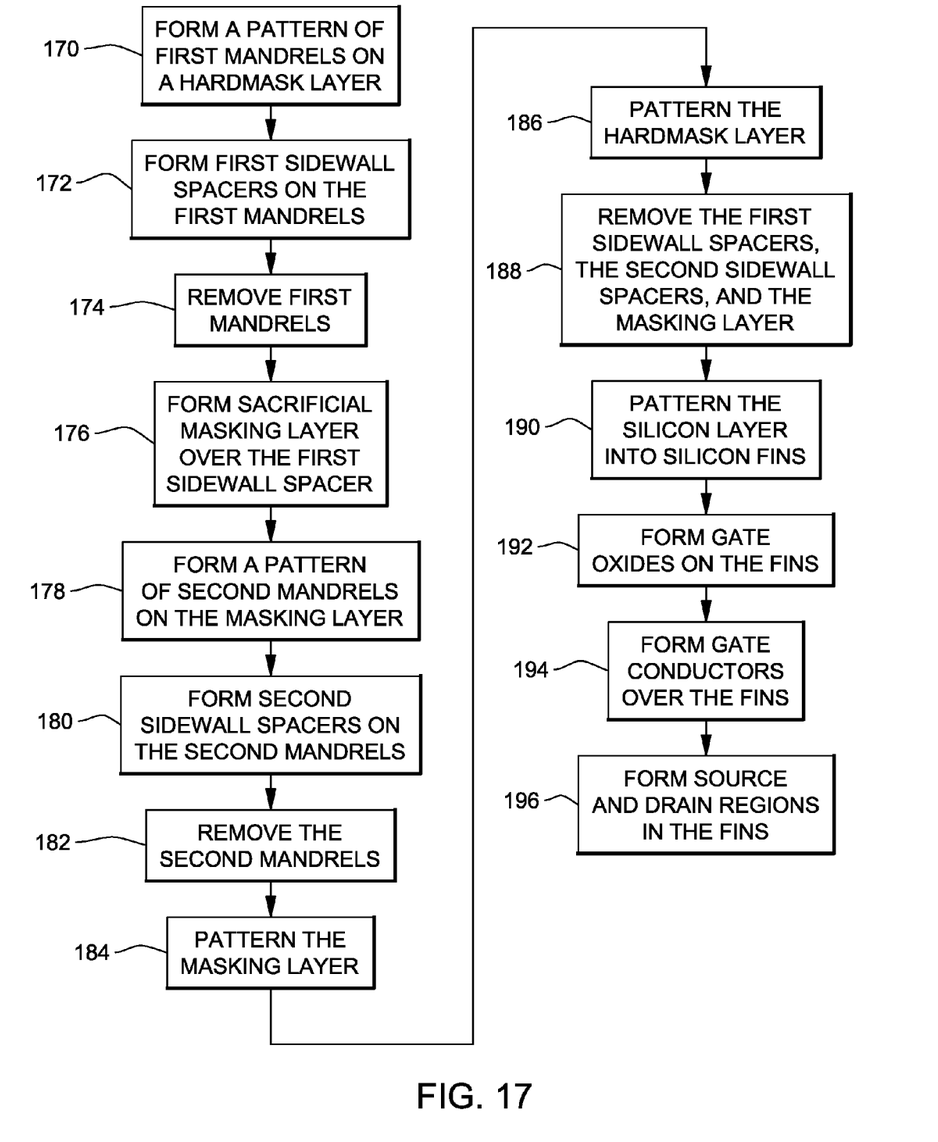
FIG. 17 is a flow diagram illustrating a method of the invention.

As shown in the flowchart in FIG. 17, with the invention a pattern of first mandrels is formed on a hardmask layer that overlies a silicon layer (substrate) 170. First sidewall spacers are formed on the first mandrels (172) and then the first mandrels are removed (174) to leave the first sidewall spacers standing free on the silicon layer.

Next, a sacrificial masking layer is formed over the first sidewall spacers (176) and a pattern of second mandrels is formed on the masking layer (178). The second mandrels are patterned parallel to and shifted from positions of the first mandrels, such that the later formed fins are parallel to each other and are evenly spaced from each other. Second sidewall spacers are formed on the second mandrels (180) and the second mandrels are also removed (182) to leave the second sidewall spacers standing free on the masking layer.

After this, the masking layer is patterned (184) using the second sidewall spacers as a mask, such that the masking layer remains only below the second sidewall spacers. Next, the hardmask layer is patterned using the first sidewall spacers and the second sidewall spacers (186). Then the first sidewall spacers, the second sidewall spacers, and the masking layer are removed (188) to leave the patterned hardmask freestanding on the silicon layer. This method then patterns the silicon layer into silicon fins (190) using the hardmask layer such that the silicon fins only remain below where the first sidewall spacers and the second sidewall spacers were positioned.

Next, gate oxides are formed on the fins (192) and gate conductors are formed over the fins at a non-perpendicular angle to the fins (194). After forming the gate conductors, the method dopes exposed portions of the fins to form source and drain regions in the fins (196).

Therefore, the invention allows the length of the FinFET fins to be increased by angling the fins with respect to the gate conductors and prevents the angled fins from increasing the size of the array by increasing the density of the fins. This allows the length of the fins to be increased or allows the size of the FinFET array to be decreased without having to decrease the length of the fins. This allows smaller FinFET arrays to be created, which makes transistor devices smaller, lighter, faster, and less expensive.

Benefits derived from the use of this invention include increased circuit density and thus decreased manufacturing cost of VLSI circuits. Furthermore, increased density results in decrease lengths of interconnects (wires) between transistors and between circuits which leads to decreased signal delay and reduced operation power. The invention is not limited specifically to the realm of silicon VLSI circuits, and can be extended to other applications, such as, Carbon Nanotube Transistors (CNT), III–V MESFETs, SiGe, SiC, Germanium on Oxide, et cetera.

While the invention has been described in terms of preferred embodiments, those skilled in the art will recognize that the invention can be practiced with modification within the spirit and scope of the appended claims.

What is claimed is:

1. A method of manufacturing fin-type field effect transistors (FinFETs), said method comprising:
   forming a silicon layer above a substrate;
   forming a mask pattern above said silicon layer using a multi-step mask formation process, wherein said multi-step mask formation process comprises:
   forming, above said silicon layer, a first mask pattern that has a plurality of first mask features; and forming, above said silicon layer, a second mask pattern that has a plurality of second mask features, wherein said forming of said second mask pattern comprises forming said second mask pattern such that said second mask features are interleaved with said first mask features;

patterning said silicon layer into silicon fins using said mask pattern such that said silicon fins remain only below said mask pattern; and forming gate conductors over said fins at a non-perpendicular angle to said fins.

2. The method in claim 1, wherein said second mask pattern is parallel to and shifted from said first mask pattern, such that said fins are parallel to each other and are evenly spaced from each other.

3. The method in claim 2, wherein said second mask pattern doubles a density of fins created during said patterning of said silicon layer, when compared to said first mask pattern alone.

4. The method in claim 1, further comprising, after forming said gate conductors, doping exposed portions of said fins to form source and drain regions in said fins.

5. The method in claim 1, further comprising forming gate oxides on said fins before forming said gate conductors.

6. The method in claim 1, wherein said substrate comprises an insulator such that said FinFETs comprise silicon-on-insulator (SOI) structures.

7. The method in claim 1, wherein said mask pattern comprises linear features.

8. A method of manufacturing fin-type field effect transistors (FinFETs), said method comprising:

forming a silicon layer above a substrate;

forming a first mask pattern above said silicon layer;

forming a second mask pattern above said silicon layer, wherein said second mask pattern is interleaved with said first mask pattern;

patterning said silicon layer into silicon fins using said first mask pattern and said second mask pattern such that said silicon fins remain only below said first mask pattern and said second mask pattern; and forming gate conductors over said fins at a non-perpendicular angle to said fins.

9. The method in claim 8, wherein said second mask pattern is parallel to and shifted from said first mask pattern, such that said fins are parallel to each other and are evenly spaced from each other.

10. The method in claim 8, wherein said forming of said second mask pattern doubles a density of fins created during said patterning of said silicon layer, when compared to said first mask pattern alone.

11. The method in claim 8, further comprising, after forming said gate conductors, doping exposed portions of said fins to form source and drain regions in said fins.

12. The method in claim 8, further comprising forming gate oxides on said fins before forming said gate conductors.

13. The method in claim 8, wherein said substrate comprises an insulator such that said FinFETs comprise silicon-on-insulator (SOI) structures.

14. The method in claim 8, wherein said first mask pattern and said second mask pattern comprise linear features.

15. A method of manufacturing fin-type field effect transistors (FinFETs), said method comprising:

forming a silicon layer above a substrate;

forming a hardmask layer above said silicon layer;

forming a pattern of first mandrels on said hardmask layer;

forming first sidewall spacers on said first mandrels;

removing said first mandrels to leave said first sidewall spacers on said hardmask layer;

forming a masking layer over said first sidewall spacers;

forming a pattern of second mandrels on said masking layer;

forming second sidewall spacers on said second mandrels;

removing said second mandrels to leave said second sidewall spacers on said masking layer;

patterning said masking layer using said second sidewall spacers as a mask, such that said masking layer remains only below said second sidewall spacers;

patterning said hardmask layer using said first sidewall spacers and said second sidewall spacers such that said hardmask layer remain only below said first sidewall spacers and said second sidewall spacers;

removing said first sidewall spacers, said second sidewall spacers, and said masking layer to leave said hardmask layer patterned on said silicon layer;

patterning said silicon layer into silicon fins using said hardmask layer; and forming gate conductors over said fins at a non-perpendicular angle to said fins.

16. The method in claim 15, wherein said second mandrels are patterned parallel to and shifted from positions of said first mandrels, such that said fins are parallel to each other and are evenly spaced from each other.

17. The method in claim 15, wherein said forming of said second sidewall spacers doubles a density of fins created during said patterning of said silicon layer, when compared to said first sidewall spacers alone.

18. The method in claim 15, further comprising, after forming said gate conductors, doping exposed portions of said fins to form source and drain regions in said fins.

19. The method in claim 15, further comprising forming gate oxides on said fins before forming said gate conductors.

20. The method in claim 15, wherein said substrate comprises an insulator such that said FinFETs comprise silicon-on-insulator (SOI) structures.

* * * * *